US006943399B1

(12) United States Patent
Gau

(10) Patent No.: US 6,943,399 B1
(45) Date of Patent: Sep. 13, 2005

(54) VARACTOR AND DIFFERENTIAL VARACTOR

(75) Inventor: Jing-Horng Gau, Hsinchu Hsien (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 10/824,266

(22) Filed: Apr. 13, 2004

(51) Int. Cl.[7] .......................................... H01L 27/108
(52) U.S. Cl. ...................... 257/312; 257/595; 257/598
(58) Field of Search ............................... 257/312, 595, 257/598

(56) References Cited

U.S. PATENT DOCUMENTS 6,407,412 B1 * 6/2002 Iniewski et al. ............ 257/107
6,521,939 B1 * 2/2003 Yeo et al. .................... 257/312

* cited by examiner

Primary Examiner—Sara Crane
(74) Attorney, Agent, or Firm—J.C. Patents

(57) ABSTRACT

A varactor is provided. The varactor includes a second type substrate, two gate structures, a first type doped region and a second type doped region. The two gate structures are disposed over the substrate, and each of the gate structures includes an inter-gate dielectric layer and a gate conductive layer. The first type doped region is disposed in the substrate between the two gate structures. The second type doped region is disposed in the substrate at a side of the two gate structures apart from the first type doped region. The first type doped region is electrically connected to a first electrode, and second type doped region is electrically connected to a second electrode, and the two gate structures are electrically connected to the first electrode or the second electrode.

14 Claims, 3 Drawing Sheets

VARACTOR AND DIFFERENTIAL VARACTOR

BACKGROUND OF THE INVENTION

1. Field of the Invention

The present invention generally relates to a varactor. More particularly, the present invention generally relates to a varactor and a differential varactor having large capacitance tuning range and large voltage tuning range.

2. Description of Related Art

In a conventional communication system such as a television program system, the data signal is tuned and being transported by the high frequency carrier wave. Since the signal of the carrier wave is dependent on the frequency, a variety of data signals with different frequency may be transported by different carrier waves. Therefore, the receiver of the communication system needs a voltage controlled oscillator (VCO) to separate the data signals from the carrier waves. A conventional voltage controlled oscillator (VCO) generally includes an inductance-capacitance (LC) circuit constructed by varactor and inductor. Thus, the oscillation frequency of the voltage controlled oscillator (VCO) may be tuned by tuning the voltage of the varactor to change the capacitance of the varactor.

The conventional varactor may be classified into MOS varactor and junction varactor. The MOS varactor is constructed by the metal oxide semiconductor (MOS) transistor structure. The junction varactor is constructed by interlaced p-type doped region and n-type doped region. The MOS varactor has a large capacitance tuning range defined as (maximum capacitance−minimum capacitance)/minimum capacitance), but the voltage tuning range of the tuning range is very small (in general, only about 1V). In other words, a fine voltage tuning may change the capacitance drastically. In summary, although the tuning range of the capacitance of MOS varactor is large, but the voltage tuning range of the capacitance is too small and therefore it is difficult to precisely control the voltgae capacitance of MOS varactor. On the other hand, the junction varactor has a large voltage tuning range (in general, larger than 2V), but the capacitance tuning range is not large enough, therefore the application of the junction varactor is limited. Accordingly, a varactor having a large voltage tuning range and large tuning capacitance is highly desirable.

SUMMARY OF THE INVENTION

Accordingly, the present invention relates to a varactor having a larger capacitance tuning range or voltage tuning range than that of the conventional varactor.

Furthermore, the present invention relates to a differential varactor having a larger capacitance tuning range or voltage tuning range than that of the conventional varactor. Therefor, a higher quality factor (Q Factor) can be achieved.

In an embodiment of the present invention, the varactor includes, for example but not limited to, a second type substrate, two gate structures, a first type doped region and a second type doped region. The two gate structures are disposed over the second type substrate, and each of the gate structures includes an inter-gate dielectric layer and a gate conductive layer on the inter-gate dielectric layer. The first type doped region is disposed in the second type substrate between the two gate structures. The second type doped region is disposed in the second type substrate at a side of the two gate structures apart from the first type doped region. The first type doped region is electrically connected to a first electrode, and the second type doped region is electrically connected to a second electrode, and the two gate structures can be electrically connected to the first electrode or the second electrode.

In an embodiment of the invention includes, the differential varactor includes, for example but not limited to, at least one pair of varactors disposed on a second type substrate, wherein each varactor comprises a first varactor and a second varactor. The first varactor comprises two first gate structures, a first type first doped region and a second type first doped region. The second varactor is adjacent to the first varactor, and the second varactor comprises two second gate structures, a first type second doped region and a second type second doped region. The two first gate structures are disposed over the second type substrate, and each first gate structure includes a first inter-gate dielectric layer at and a first gate conductive layer on the first inter-gate dielectric layer. The first type first doped region is disposed in the second type substrate between the two first gate structures. The second type first doped region is disposed in the second type substrate at a side of the two first gate structures apart from the first type first doped region. The two second gate structures are disposed over the second type substrate, and each second gate structure includes a second inter-gate dielectric layer and a second gate conductive layer on the second inter-gate dielectric layer. The first type second doped region is disposed in the second type substrate between the two second gate structures. The second type second doped region is disposed in the second type substrate at a side of the two second gate structures apart from the first type second doped region, and second type second doped region is adjacent to the second type first doped region. The first gate structure and first type first doped region are electrically connected to a tuning voltage, and the second gate structure and the first type second doped region are electrically connected to a relative tuning voltage. The second type first doped region and the second type second doped region are grounded.

Since the aforementioned varactor or the differential varactor comprise the structure of MOS varactor having the gate structures and junction varactor having the first type doped region and the second type doped region, the varactor or the differential varactor has the advantages of the two different conventional varactors. Therefore, the capacitance tuning range and the voltage tuning range are larger than that of the two conventional varactors. In addition, a higher quality factor (Q Factor) can be achieved.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The following drawings illustrate embodiments of the invention and, together with the description, serve to explain the principles of the invention.

DESCRIPTION OF THE PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Hereinafter, in the embodiments of the invention, the first type and the second type are described as p-type doping type and n-type doping type respectively. However, those skilled in the art will understand that the first type and the second type may also be n-type doping type and p-type doping type respectively. Furthermore, in the embodiments of the invention, the first electrode and the second electrode are provided as anode and cathode respectively. Those skilled in the art will however understand that the first electrode and the second electrode may also be provided as cathode and anode respectively.

Figure 1:
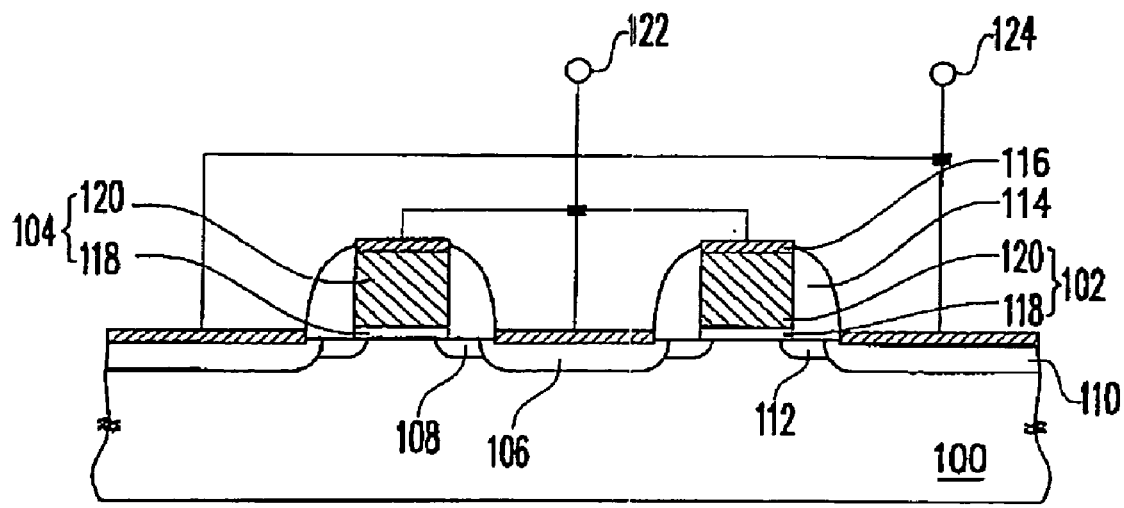
FIG. 1 is a cross-sectional view schematically illustrating a varactor according to an embodiment of the present invention.

FIG. 1 is a cross-sectional view schematically illustrating a varactor according to an embodiment of the present invention. Referring to FIG. 1, the varactor includes, for example but not limited to, an n-type substrate 100, two gate structures 102 and 104, a p-type doped region 106 and n-type doped region 110. In another embodiment, the varactor further includes a p-type lightly doped region 108, an n-type lightly doped region 112, a gap wall 114 and a polycide layer 116.

As shown in FIG. 1, the gate structures 102 and 104 are disposed over the n-type substrate 100, and each of the gate structures 102 and 104 comprises an inter-gate dielectric layer 118 and a gate conductive layer 120 disposed over the inter-gate dielectric layer 118. In another embodiment, the gate structures 102 and 104 may also be disposed on a p-type substrate (not shown) having an n-type well region (not shown). The inter-gate dielectric layer 118 includes, for example but not limited to, silicon oxide, silicon nitride or other applicable dielectric materials. The gate conductive layer 120 includes, for example but not limited to, polysilicon, doped polysilicon or other applicable conductive material.

Furthermore, the p-type doped region 106 is disposed in the n-type substrate 100 between the gate structures 102 and 104, and thus the p-type doped region 106 is commonly shared by gate structures 102 and 104. In another embodiment, a p-type lightly doped region 108 is further disposed in the n-type substrate 100 adjacent to the p-type doped region 106.

Moreover, the n-type doped region 110 is disposed in the n-type substrate 100 on a side of the gate structures 102 and 104 apart from p-type doped region 106. In another embodiment, an n-type lightly doped region 112 is further disposed in the n-type substrate 100 adjacent to the n-type doped region 110.

In one embodiment, a spacer 114 is further formed on the sidewalls of the gate structures 102 and 104 covering the p-type lightly doped region 108 and the n-type lightly doped region 112. In another embodiment, a polycide layer 116 is further disposed over the gate conductive layer 120 of the gate structures 102 and 104, the p-type doped region 106 and the n-type doped region 110. Therefore, the resistance of the gate structures 102 and 104, the p-type doped region 106 and the n-type doped region 110 are reduced and thus the conductivity thereof are enhanced.

It is noted that, the p-type doped region 106 is electrically connected to a first electrode 122 (for example but not limited to, an anode), and the n-type doped region 110 is electrically connected to a second electrode 124 (for example but not limited to, a cathode). In addition, the gate structures 102 and 104 are electrically connected to the first electrode 122.

Figure 4:
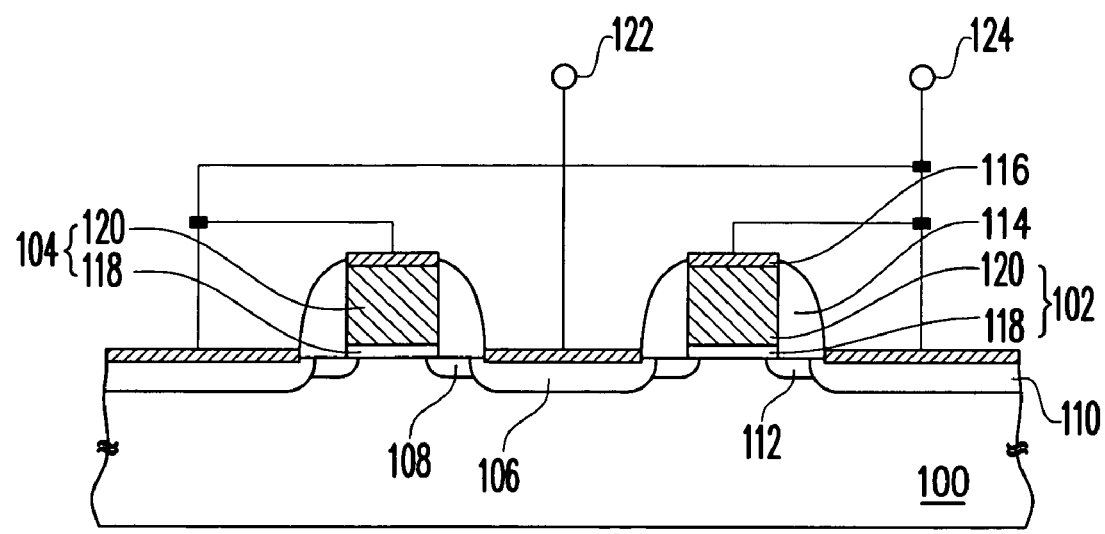
FIG. 4 is a cross-sectional view schematically illustrating a varactor according to an embodiment of the present invention.

Alternatively, the gate structures 102 and 104 may also be electrically connected to the second electrode 124 (for example but not limited to, a cathode) as shown in FIG. 4. As shown in FIG. 4, the p-type doped region 106 is electrically connected to the first electrode 122 (for example but not limited to, an anode), and the n-type doped region 110 is electrically connected to the second electrode 124.

Accordingly, because the above-described varactor comprises a MOS varactor having the gate structures 102 or 104, and a junction varactor having the p-type doped region 106 and the n-type doped region 110, the varactor of the invention has the advantages of a MOS varactor and a junction varactor. In other words, the varactor of the present invention may store electrical charges in the inter-gate dielectric layer 118 instead of storing charges in region between p-type doped region 106 and n-type doped region 110. Therefore, the varactor of the present invention has a better storage capability than the conventional varactor. In other words, the capacitance tuning range of the varactor of the invention is larger than the conventional MOS varactor or junction varactor.

Furthermore, the distance between the p-type doped region 106 and the n-type doped region 110 of the varactor of the present invention is controlled by the line width of the gate structures 102 and 104. In other words, the narrower the line width of the gate structures 102 and 104, the smaller the distance between the p-type doped region 106 and the n-type doped region 110, therefore, the resistance of the varactor is reduced. Thus, the quality factor (Q Factor) of the varactor is enhanced.

Figure 2:
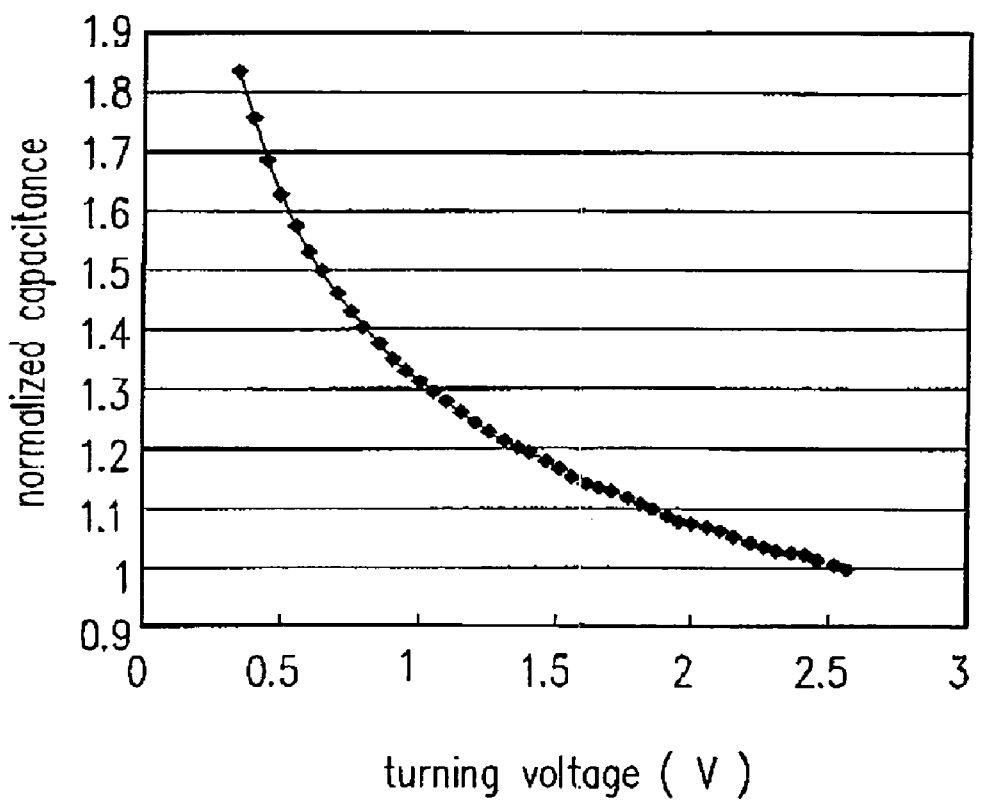
FIG. 2 is a plot illustrating the relationship between the tuning voltage and the normalized capacitance of the varactor.

Moreover, in order to demonstrate the improvements in the capacitance tuning range and the voltage tuning range of the varactor described above, the relationship of tuning voltage and corresponding capacitance of the varactor is plotted and the result is shown in FIG. 2. FIG. 2 is a plot illustrating the relationship between the tuning voltage and the normalized capacitance of the varactor. Referring to FIG. 2, it is noted that the capacitance tuning range is extended up to 70% in a voltage tuning range between about 0.5V to about 2.5V. In general, the capacitance tuning range of a conventional junction varactor is only up to about 40%, therefore the capacitance tuning range of the invention is much higher than that of the conventional junction varactor. In addition, the voltage tuning range of the MOS varactor is only about 1V, therefore the tunable voltage capacitance of the invention is much larger than that of the MOS varactor.

Figure 3:
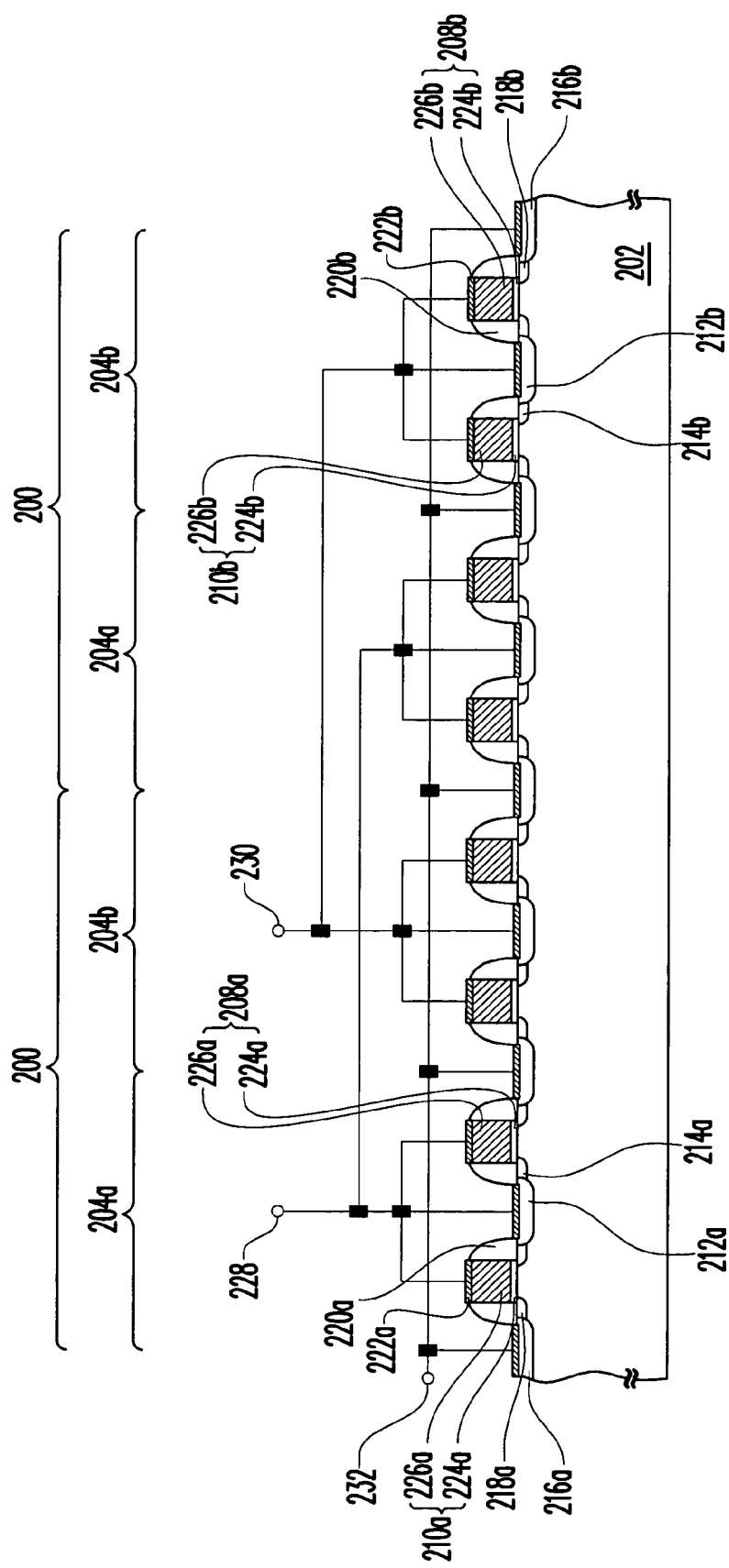
FIG. 3 is a cross-sectional view schematically illustrating a differential varactor according to an embodiment of the present invention.

FIG. 3 is a cross-sectional view schematically illustrating a differential varactor according to an embodiment of the present invention. Referring to FIG. 3, the differential varactor of the present invention includes, for example but not limited to, at least two varactor pairs 200 disposed over a n-type substrate 202, wherein each varactor pair 200 comprises a varactor 204a and a varactor 204b.

The varactor 204a includes, for example but not limited to, two gate structures 208a and 210a, a p-type doped region 212a and an n-type doped region 216a. In another embodiment, the varactor 204a further comprises a p-type lightly doped region 214a, an n-type lightly doped region 218a, a gap wall 220a and a polycide layer 222a.

The gate structures 208a and 210a are disposed over the n-type substrate 202, and each gate structure 208a and 210a includes an inter-gate dielectric layer 224a and a gate conductive layer 226a disposed on the inter-gate dielectric layer 224a. The gate structures 208a and 210a may also be disposed over a p-type substrate (not shown) having an n-type well region (not shown). The material of the inter-gate dielectric layer 224a includes, for example but not limited to, silicon oxide, silicon nitride or other applicable dielectric materials. The gate conductive layer 226a includes, for example but not limited to, polysilicon, doped polysilicon or other applicable conductive materials.

Furthermore, a p-type doped region 212a is disposed in the n-type substrate 202 between the gate structures 208a and 210a, and thus the p-type doped region 212a is commonly shared by gate structures 208a and 210a. In another embodiment, a p-type lightly doped region 214a is further disposed in the n-type substrate 202 adjacent to the p-type doped region 212a.

Moreover, an n-type doped region 216a is disposed in the n-type substrate 202 on a side of the gate structures 208a and 210a apart from the p-type doped region 212a. In another embodiment, an n-type lightly doped region 218a is further disposed in the n-type substrate 202 adjacent to the n-type doped region 216a.

In a still embodiment, a spacer 220a is further formed on the sidewalls of the gate structures 208a and 210a covering the p-type lightly doped region 214a and the n-type lightly doped region 218a. In another still embodiment, a polycide layer 222a is further disposed over the gate conductive layer 226a of the gate structures 208a and 210a, the p-type doped region 212a and the n-type doped region 216a. Therefore, the resistance of the gate structures 208a and 210a, the p-type doped region 212a and the n-type doped region 216a can be reduced and the conductivity thereof can be enhanced.

Furthermore, referring to FIG. 3, the varactor 204b is disposed adjacent to the varactor 204a, and the varactor 204b includes, for example but not limited to, two gate structures 208b and 210b, a p-type doped region 212b and an n-type doped region 216b. In another embodiment, the varactor 204b further comprises a p-type lightly doped region 214b, an n-type lightly doped region 218b, a spacer 220b and a polycide layer 222b. Each gate structure 208b and 210b includes an inter-gate dielectric layer 224b and a gate conductive layer 226b disposed on the inter-gate dielectric layer 224b. Furthermore, the n-type doped region 216b of the varactor 204b is adjacent to the n-type doped region 216a of the varactor 204a, and may be regarded as the same doped region. Moreover, the configuration of other components of the varactor 204b is similar to the varactor 204a and therefore will not be described in detail hereinafter.

It is noted that, the gate structures 208a and 210a and the p-type doped region 212a of the varactor 204a are electrically connected to a tuning voltage source 228. In addition, the gate structures 208b and 210b and the p-type doped region 212b of the varactor 204b are electrically connected to a relative tuning voltage source 230. Therefore, the n-type doped regions 216a and 216b between the tuning voltage source 228 and the relative tuning voltage source 230 are grounded due to the interaction between the tuning voltage and the relative tuning voltage. Therefore, the resistance of the differential varactor is reduced and the quality factor (Q factor) is enhanced.

In summary, as the varactor described in the foregoing embodiment of the invention, the differential varactor of the invention also includes a MOS varactor having the gate structures 208a, 208b, 210a or 210b, and a junction varactor having the p-type doped regions 212a and 212b and the n-type doped regions 216a and 216b. Therefore, the aforementioned differential varactor also has the advantages of the MOS varactor and the junction varactor. In other words, the differential varactor of the invention has a better storage capability, a larger capacitance tuning range and a larger voltage tuning range than that of the conventional MOS varactor and the junction varactor. In addition, a higher quality factor (Q Factor) can be achieved when the differential varactor is operated under differential mode.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A varactor, comprising:
   a first type substrate;
   two gate structures, disposed over the first type substrate, each of the gate structures comprising an inter-gate dielectric layer and a gate conductive layer on the inter-gate dielectric layer;
   a second type doped region, disposed in the first type substrate between the two gate structures; and
   a first type doped region, disposed in the first type substrate at a side of the two gate structures apart from the second type doped region;
   wherein the second type doped region is electrically connected to a first electrode, and the first type doped region is electrically connected to a second electrode, and the two gate structures are electrically connected with the first electrode or the second electrode.

2. The varactor of claim 1, wherein the second type doped region is a p-type doped region, and the first type doped region is an n-type doped region.

3. The varactor of claim 1, wherein the second type doped region is an n-type doped region, and the first type doped region is a p-type doped region.

4. The varactor of claim 1, further comprising:
   a polycide layer, disposed over the gate conductive layer, the first type doped region and the second type doped region.

5. The varactor of claim 1, further comprising:
   a second type lightly doped region, disposed in the first type substrate adjacent to the second type doped region; and
   a first type lightly doped region, disposed in the first type substrate adjacent to the first type doped region.

6. The varactor of claim 5, further comprising:
   a spacer, disposed over a sidewall of each of the gate structures covering the first type lightly doped region and the second type lightly doped region.

7. A differential varactor, comprising:
   at least one pair of varactors, disposed over a first type substrate, wherein each of the varactors comprising:

a first varactor, the first varactor comprising:
- two first gate structures, disposed over the first type substrate and each of the first gate structures comprising a first inter-gate dielectric layer and a first gate conductive layer on the first inter-gate dielectric layer;
- a second type first doped region, disposed in the first type substrate between the two first gate structures; and
- a first type first doped region, disposed in the first type substrate at a side of the two first gate structures apart from the second type first doped region; and a second varactor, adjacent to the first varactor, the second varactor comprising:
- two second gate structures, disposed over the first type substrate, and each of the second gate structures comprises a second inter-gate dielectric layer and a second gate conductive layer on the second inter-gate dielectric layer;
- a second type second doped region, disposed in the first type substrate between the two second gate structures; and
- a first type second doped region, disposed in the first type substrate at a side of the two second gate structures apart from the second type second doped region, wherein the first type second doped region is adjacent to the first type first doped region, wherein, the first gate structure and the second type first doped region are electrically connected to a tuning voltage, and the second gate structure and the second type second doped region are electrically connected to a relative tuning voltage, and the first type first doped region and the first type second doped region are grounded.

8. The differential varactor of claim 7, wherein the first type second doped region and the second type second doped region are p-type doped regions, and the first type first doped region and the first type second doped region are n-type doped regions.

9. The differential varactor of claim 7, wherein the first type second doped region and the second type second doped region are n-type doped regions, and the first type first doped region and the first type second doped region are p-type doped regions.

10. The differential varactor of claim 7, further comprising:
- a polycide layer, disposed over the first gate conductive layer, the second gate conductive layer, the first type first doped region, the first type second doped region, the second type first doped region and the second type second doped region.

11. The differential varactor of claim 7, further comprising:
- a second type lightly doped region, disposed in the first type substrate adjacent to the second type first doped region; and
- a first type lightly doped region, disposed in the first type substrate adjacent to the first type first doped region.

12. The differential varactor of claim 11, further comprising:
- a spacer, disposed over a sidewall of each of the first gate structures covering the first type lightly doped region and the second type lightly doped region.

13. The differential varactor of claim 7, further comprising:
- a second type lightly doped region, disposed in the first type substrate adjacent to the second type second doped region; and
- a first type lightly doped region, disposed in the first type substrate adjacent to the first type second doped region.

14. The differential varactor of claim 13, further comprising:
- a spacer, disposed over a sidewall of each of the second gate structures covering the first type lightly doped region and the second type lightly doped region.

* * * * *